(12) United States Patent
Ban et al.

(10) Patent No.: US 7,575,976 B2
(45) Date of Patent: Aug. 18, 2009

(54) LOCALIZED SPACER FOR A MULTI-GATE TRANSISTOR

(75) Inventors: Ibrahim Ban, Beaverton, OR (US); Uday Shah, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 20 days.

(21) Appl. No.: 11/729,033

(22) Filed: Mar. 28, 2007

(65) Prior Publication Data

US 2008/0237710 A1    Oct. 2, 2008

(51) Int. Cl.
    *H01L 21/336* (2006.01)
(52) U.S. Cl. ............... 438/283; 438/157; 438/164; 438/197
(58) Field of Classification Search ............ 438/157, 438/164, 197, 283
    See application file for complete search history.

(56) References Cited

U.S. PATENT DOCUMENTS

| | | | |
|---|---|---|---|
| 2003/0013243 A1* | 1/2003 | Doumae | 438/197 |
| 2007/0048958 A1* | 3/2007 | Liao et al. | 438/369 |
| 2007/0111454 A1* | 5/2007 | Yeo et al. | 438/283 |
| 2008/0149984 A1* | 6/2008 | Chang et al. | 257/314 |
| 2008/0186752 A1* | 8/2008 | Kim | 365/63 |

OTHER PUBLICATIONS

U.S. Appl. No. 11/395,860, filed Mar. 31, 2006, entitled "Stacked Multi-Gate Transistor Design And Method Of Fabrication," by Brian S. Doyle, et al.
U.S. Appl. No. 11/499,127, filed Aug. 4, 2006, entitled "Double Gate Transistor, Method Of Manufacturing Same, And System Containing Same," by Ibrahim Ban.
U.S. Appl. No. 11/474,153, filed Jun. 23, 2006, entitled "Double Gate Transistor, Method Of Manufacturing Same, And System Containing Same," by Ibrahim Ban and Uday Shah.

* cited by examiner

*Primary Examiner*—Fernando L Toledo
*Assistant Examiner*—Jae Lee
(74) *Attorney, Agent, or Firm*—Trop, Pruner & Hu, P.C.

(57) ABSTRACT

In one embodiment, the present invention includes a double gate transistor having a silicon fin formed on a buried oxide layer and first and second insulation layers formed on a portion of the silicon fin, where at least the second insulation layer has a pair of portions extending onto respective first and second portions of the silicon fin to each act as a self-aligned spacer structure. Other embodiments are described and claimed.

7 Claims, 2 Drawing Sheets

LOCALIZED SPACER FOR A MULTI-GATE TRANSISTOR

BACKGROUND

Transistors are foundational devices of the semiconductor industry. One type of transistor, the field effect transistor (FET), has among its components gate, source, and drain terminals. A voltage applied between the gate and the source terminals generates an electric field that creates an "inversion channel" through which current can flow. Such current flow may be controlled by varying the magnitude of the applied voltage.

Many configurations and fabrication methods have been devised for transistor gate terminals (as well as for other transistor components). One such configuration is what is called a double gate transistor, in which a transistor has two gates instead of a single gate. Forming such a transistor can raise certain difficulties such as tip implants into a non-gated or channel region of the transistor, which can cause undesired off-state leakage.

DETAILED DESCRIPTION

In various embodiments, self-aligned tip spacers may be provided in a multi-gate transistor structure to mask a portion of a silicon-on-insulator (SOI) structure. By masking off a part of the SOI structure, these spacers may act as masks to prevent implantation into the area under them, while the side surfaces of the SOI structure are implanted as needed. This is so, as diffusions that are performed to implant tip material can occur at an angle such as a 45° angle.

Figure 1:
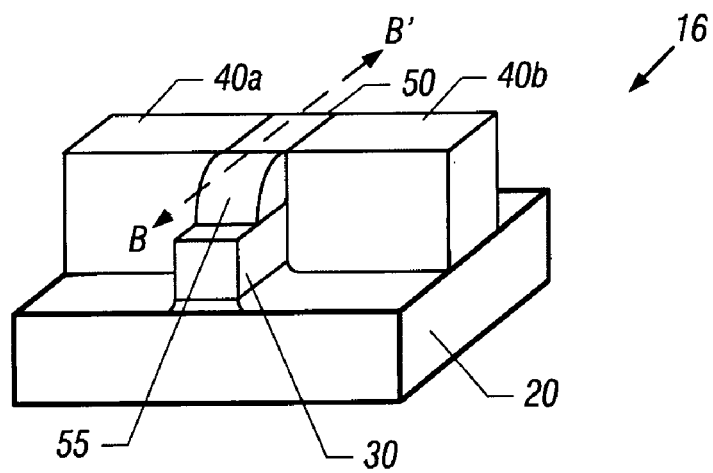
FIG. 1 is a plan view of a double gate transistor in accordance with an embodiment of the present invention.

Referring now to FIG. 1, shown is a plan view of a double gate transistor 10 in accordance with an embodiment of the present invention. As shown in FIG. 1, transistor 10 includes a buried oxide layer (BOX) 20. While not shown in FIG. 1, it is to be understood that BOX 20 may be formed on a suitable substrate such as a silicon substrate. A silicon structure 30, which may be a SOI layer that is patterned into a fin-type structure formed on BOX 20. In turn, a front gate 40a and a back gate 40b, which may be formed of polysilicon may be deposited and patterned to form the front and back gates respectively. Front and back gates 40a and 40b may be separated by an insulator 50 which may be a nitride layer, for example. A high dielectric constant (high-K) material may be present at the interfaces between the sidewalls of SOI 30 and gates 40a and 40b, as the high-K insulator may be formed prior to gate polysilicon deposition. To mask off a portion of the top surface of SOI 30, a localized spacer 55 may be formed, also of nitride, for example. While only shown on one side of transistor 10, it is to be understood that a corresponding spacer may be formed on the other side of transistor 10.

Figure 2A:
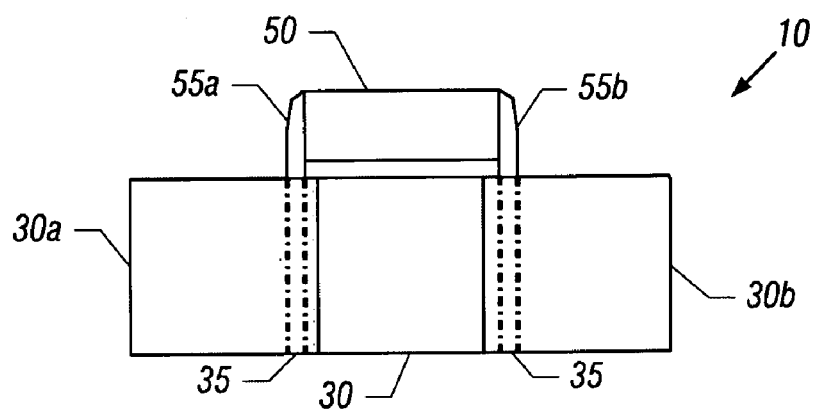
FIGS. 2A and 2B are cross-section and top views of the embodiment of FIG. 1.
Figure 2B:
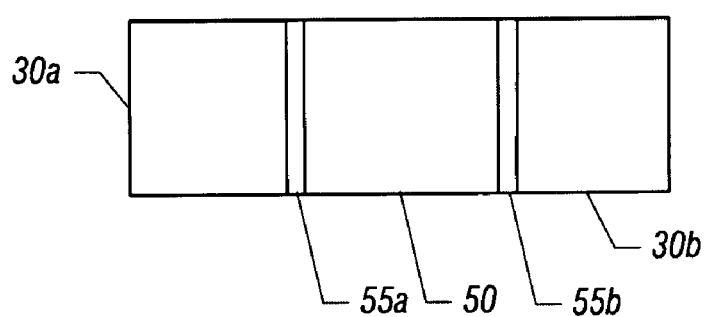

FIG. 2A shows a cross-section view along the line B-B' of FIG. 1 and a top down view of the transistor structure, respectively. Specifically, as shown in FIG. 2A by presence of tip spacers 55a and 55b, after diffusion of implants zero or reduced diffusions are present in locations 35 immediately underneath spacers 55a and 55b. Instead, the implants are primarily provided in portions 30a and 30b, while pure silicon remains in SOI portion 30. Similarly, from a top down view as shown in FIG. 2B spacers 55a and 55b abut insulator 50 to provide a mask over the underlying portions 35 of SOI 30.

Figure 3:
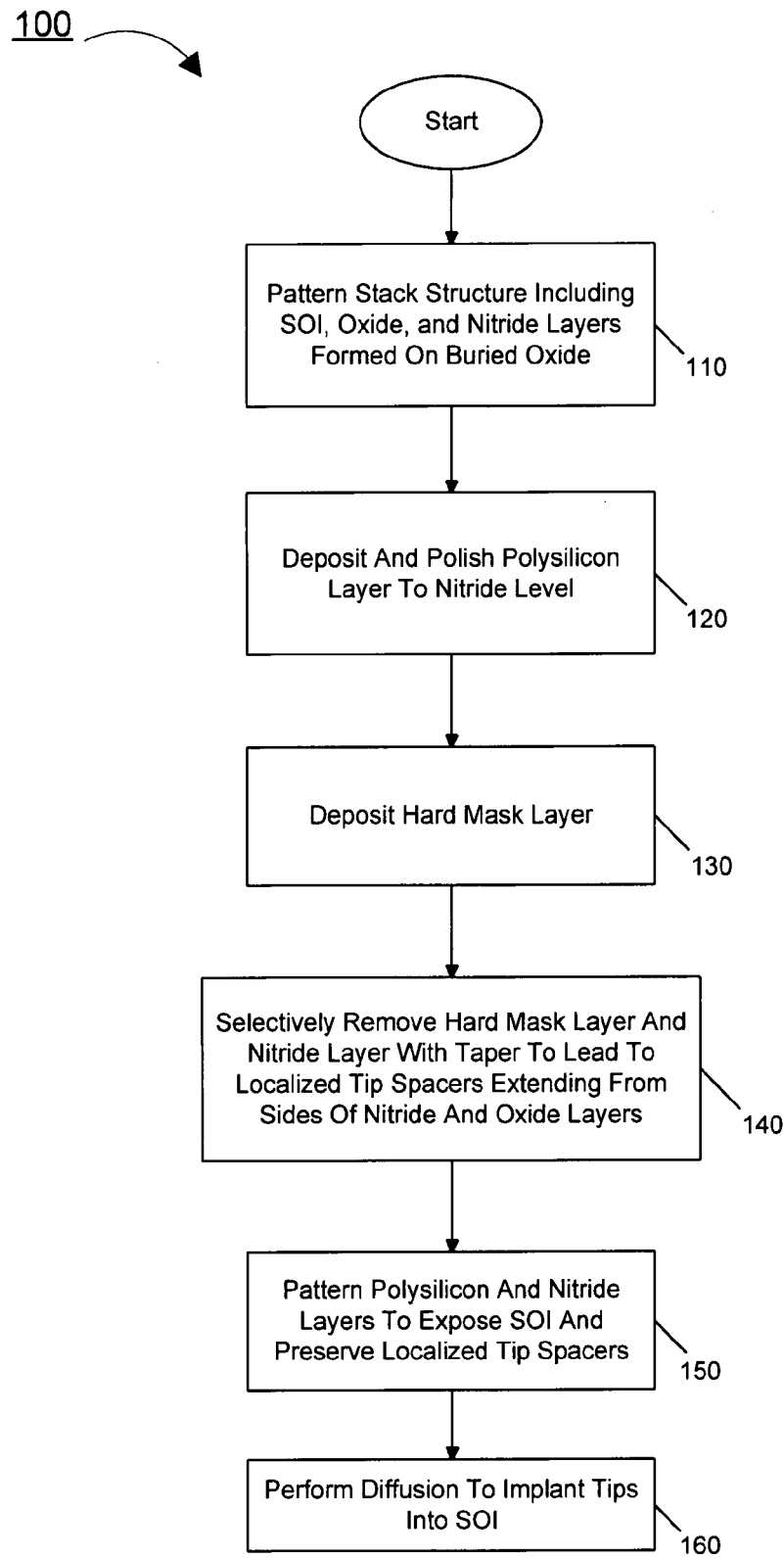
FIG. 3 is a flow diagram of a method for forming self-aligned tip spacers in accordance with one embodiment of the present invention.

Referring now to FIG. 3, shown is a flow diagram of a method in accordance with one embodiment of the present invention. As shown in FIG. 3, method 100 may be used to form a double gate transistor in accordance with one embodiment. Method 100 may begin by patterning a stack structure that is formed of multiple layers including a SOI layer, an oxide layer, and a nitride layer (block 110). Specifically, trenches may be formed on either side of a stack by performing nitride and SOI dry etching. Thus a silicon fin may be formed over an underlying oxide layer, e.g., a BOX layer that is exposed on either side of the fin, with dielectric and insulation layers formed over the fin.

Referring still to FIG. 3, then at block 120 a polysilicon layer may be deposited and then polished down to the level of the nitride layer. Note that polysilicon does not exist along the stack profile after the polishing step. The polysilicon may be used to form the double gates, i.e., on either side of the stack. Then at block 130 a hard mask layer may be deposited, which may be a nitride-based hard mask, in some embodiments.

Referring still to FIG. 4 at block 140, the hard mask and underlying nitride layer may be selectively removed, e.g., via an etch process that will lead to localized tip spacers that extend from both sides of the insulation layers longitudinally. After the hard mask etch, the hard mask is completely etched away with most of the nitride layer underneath. At the same time, polysilicon, when exposed, is also eroded. Laterally, however, the hard mask etch can be designed to give a slight flare, and at the bottom of the hard mask flare the nitride layer is also tapered during the same etch process. Consequently, this flare is transferred to the underlying nitride layer. Note that the dual stack hard mask/nitride may be patterned with photoresist. Therefore, spacers will be formed at the nitride sidewalls due to this tapering. This taper is the main reason for the spacer to be created on top of the SOI during the subsequent processing steps.

The amount of nitride recessed laterally may be controlled during the final part of the etch sequence so as to not eliminate this spacer. In various embodiments, a predetermined control of radio frequency (RF) power and etch chemistry may be implemented. For example, in some embodiments a derivative of a conventional plasma etch may be used. Further, RF power may be modified. Specifically a power in the 500-1500 watts (W) range may change the extent of the spacer footing. Still further, pressures may be changed from approximately 100 to 200 milliTorrs (mT) to enable this flared shape rather than a vertical etch. Typical etch chemistries include methyl fluoride, carbon monoxide and oxygen ($CH_3F$, $CO$ and $O_2$). This subsequent nitride etch can also be carried out immediately post polysilicon etch, without inserting a break in the etch step (between poly and nitride etch). Various tool configurations such as electron cyclotron resonance (ECR) or inductively coupled plasma (ICP) sources can also be employed to etch the nitride on the SOI to create the final desired structure.

Referring still to FIG. 4, another patterning process may be performed to remove polysilicon from the non-gate, i.e., the implantation regions, to thus expose the SOI fin (block 150). Specifically, a polysilicon etch may be followed by a slight nitride-clean dry etch step, such that the SOI is exposed, with no spacer along its sidewalls, while the self-aligned nitride spacer remains along the insulation layers' sidewalls. This patterning thus preserves the localized tip spacers. The top hard mask can then be stripped off to give the final structure.

This etching will enable diffusion of source and drain materials into the SOI fin. Furthermore, due to the self-aligned tip spacers, these tip implantations will not impinge into the channel region present under the stack. These self-aligned tip spacers may thus act as a mask on the top surface of the SOI fin extending from the insulation layer to protect a channel region present under the remaining insulation layer. Thus, diffusions may be performed to implant tips into the SOI fin (block 160). Further processing may be performed to form the source and drains, metallization contacts and so forth.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a buried oxide layer on a substrate;
   forming a silicon layer on the buried oxide layer;
   forming first and second insulation layers on the silicon layer;
   patterning the first and second insulation layers and the silicon layer to form a stack;
   depositing and polishing a polysilicon layer on both sides of the stack to a level of the second insulation layer of the stack;
   depositing a hard mask layer;
   selectively removing a portion of the hard mask layer and the second insulation layer to form a pair of self-aligned spacer structures over respective portions of the silicon layer; and
   patterning the polysilicon layer to form a pair of gates and expose a portion of the silicon layer not covered by the self-aligned spacer structures.

2. The method of claim 1, further comprising performing a tip implantation to implant tip material into the exposed portion of the silicon layer.

3. The method of claim 2, wherein the self-aligned spacer structures are to block the tip material from impinging into at least a portion of the silicon layer under the second insulation layer.

4. The method of claim 1, further comprising forming the self-aligned spacer structures with a tapered profile.

5. The method of claim 4, further comprising adjusting an etch density of an etch process to provide the tapered profile.

6. The method of claim 5, further comprising adjusting a radio frequency of the etch process to provide the tapered profile.

7. The method of claim 3, further comprising forming a double gate transistor with the pair of gates.

* * * * *